US012575434B2

(12) United States Patent
Lin et al.

(10) Patent No.: US 12,575,434 B2
(45) Date of Patent: Mar. 10, 2026

(54) SEMICONDUCTOR ASSEMBLY HAVING DUAL CONDUCTION CHANNELS FOR ELECTRICITY AND HEAT PASSAGE

(71) Applicant: BRIDGE SEMICONDUCTOR CORP., Taipei (TW)

(72) Inventors: Charles W. C. Lin, Singapore (SG); Chia-Chung Wang, Hsinchu County (TW)

(73) Assignee: BRIDGE SEMICONDUCTOR CORP., Taipei City (TW)

( * ) Notice: Subject to any disclaimer, the term of this patent is extended or adjusted under 35 U.S.C. 154(b) by 482 days.

(21) Appl. No.: 18/185,160

(22) Filed: Mar. 16, 2023

(65) Prior Publication Data

US 2024/0063105 A1 Feb. 22, 2024

Related U.S. Application Data

(60) Provisional application No. 63/398,957, filed on Aug. 18, 2022.

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 23/367* (2013.01); *H01L 24/06* (2013.01); *H01L 24/32* (2013.01); *H01L 24/37* (2013.01); *H01L 24/40* (2013.01); *H01L 25/16* (2013.01); *H01L 2224/0603* (2013.01);
(Continued)

(58) Field of Classification Search
CPC ............. H01L 23/49827; H01L 23/367; H01L 21/768; H01L 24/06; H01L 24/32; H01L 24/37; H01L 24/40; H01L 25/16; H01L 2224/0603; H01L 2224/06181;
(Continued)

(56) References Cited

U.S. PATENT DOCUMENTS 6,008,536 A * 12/1999 Mertol ................... H01L 23/367
257/713
6,225,694 B1 * 5/2001 Terui ..................... H01L 23/552
257/E23.079
(Continued)

FOREIGN PATENT DOCUMENTS

CN 110429071 A 11/2019

*Primary Examiner* — Peniel M Gumedzoe
(74) *Attorney, Agent, or Firm* — MUNCY, GEISSLER, OLDS & LOWE, P.C.

(57) ABSTRACT

A semiconductor assembly includes a top substrate and a base substrate attached to top and bottom electrode layers of a semiconductor device, respectively. The top substrate includes an electrode connection plate thermally conductible with and electrically connected to the top electrode layer of the semiconductor device and vertical posts protruding from the electrode connection plate and electrically connected to the base substrate. The base substrate includes an electrode connection slug embedded in a dielectric layer and thermally conductible with and electrically connected to the bottom electrode layer of the semiconductor device and first and second routing circuitries deposited on two opposite surfaces of the dielectric layer, respectively, and electrically connected to each other.

17 Claims, 14 Drawing Sheets

(51) Int. Cl.
    *H01L 23/00*         (2006.01)
    *H01L 23/367*      (2006.01)
    *H01L 25/16*        (2023.01)

(52) U.S. Cl.
    CPC ............... *H01L 2224/06181* (2013.01); *H01L 2224/32227* (2013.01); *H01L 2224/37012* (2013.01); *H01L 2224/40137* (2013.01); *H01L 2224/40227* (2013.01)

(58) Field of Classification Search
    CPC . H01L 2224/32227; H01L 2224/37012; H01L 2224/40137; H01L 2224/40227
    See application file for complete search history.

(56) References Cited

U.S. PATENT DOCUMENTS

| | | | |
|---|---|---|---|
| 9,589,868 B2 | 3/2017 | McKnight-MacNeil et al. | |
| 11,133,245 B2 | 9/2021 | Chiu et al. | |
| 2020/0135619 A1 | 4/2020 | Dinkel et al. | |
| 2020/0203304 A1 | 6/2020 | Gulino et al. | |
| 2022/0230941 A1* | 7/2022 | Dinkel ................ | H01L 23/5383 |

* cited by examiner

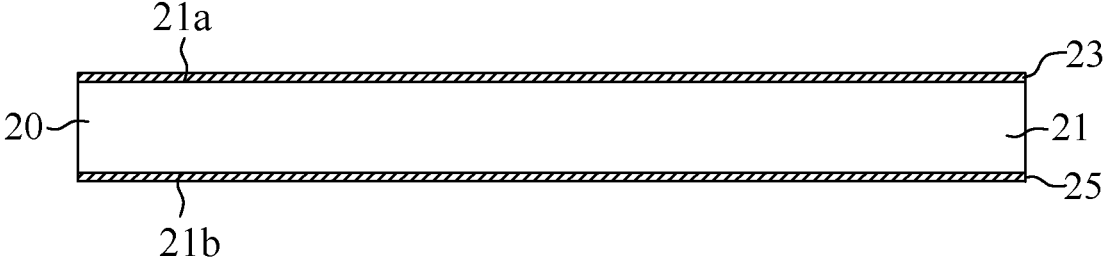
FIG.1
FIG.2
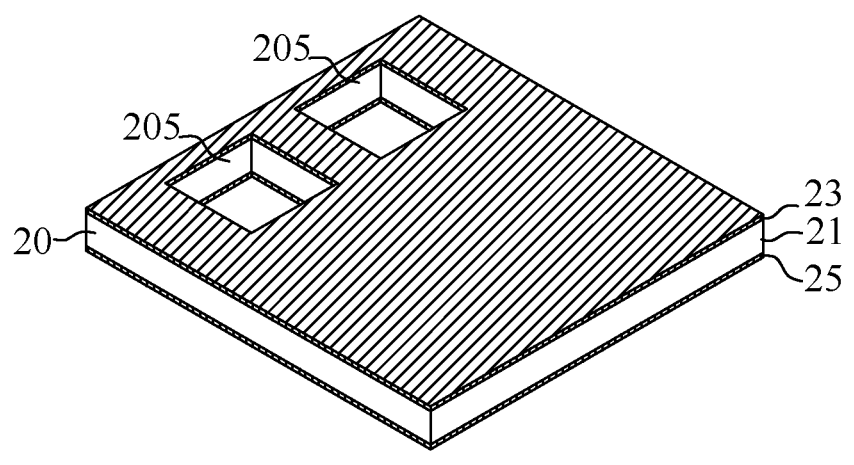
FIG.3

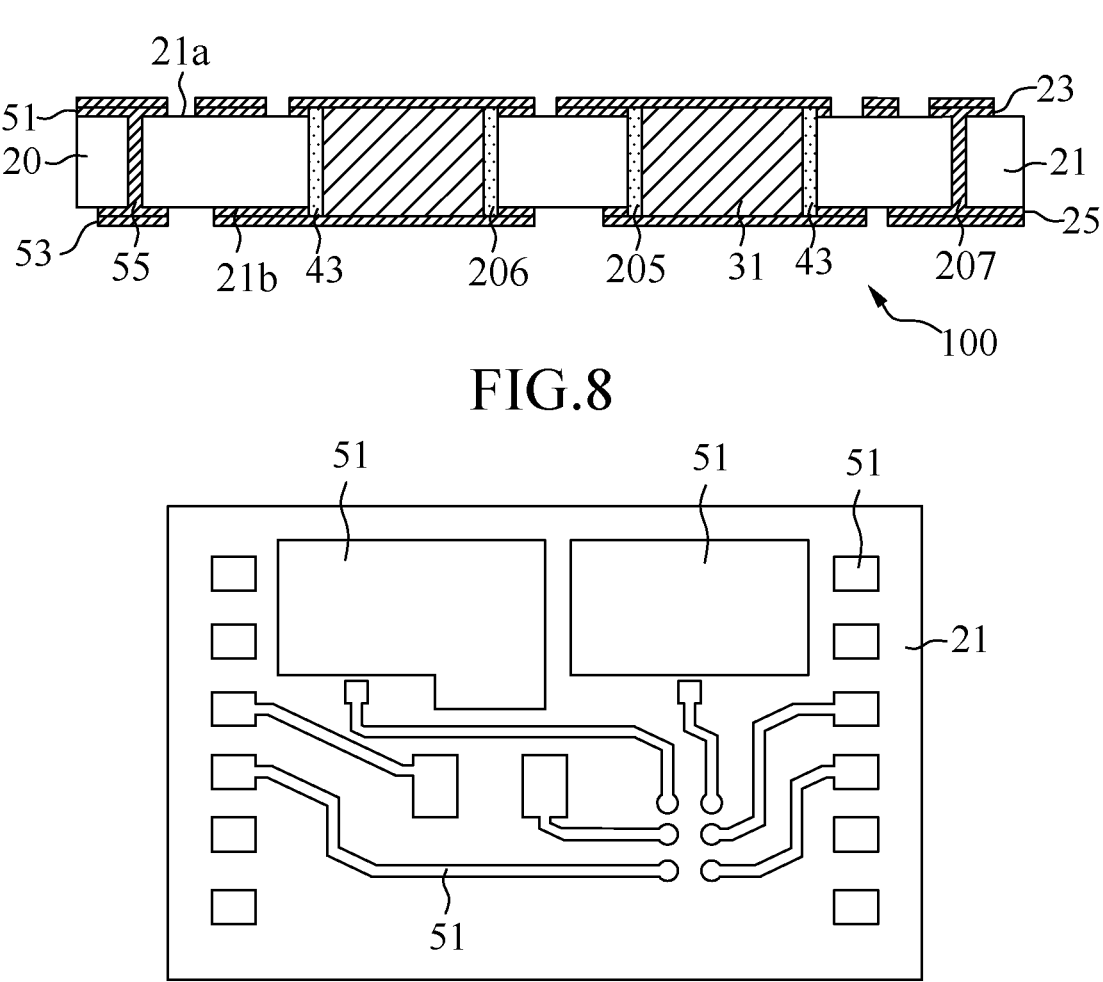
FIG.8
FIG.9
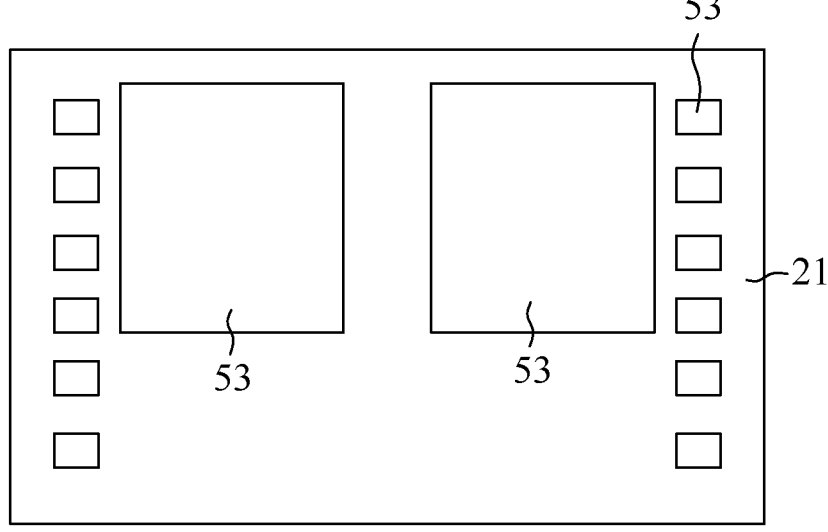
FIG.10

SEMICONDUCTOR ASSEMBLY HAVING DUAL CONDUCTION CHANNELS FOR ELECTRICITY AND HEAT PASSAGE

CROSS REFERENCE TO RELATED APPLICATIONS

This application claims priority of U.S. Provisional Application No. 63/398,957 filed on Aug. 18, 2022 under 35 U.S.C. § 119(e), the entire contents of all of which are hereby incorporated by reference.

FIELD OF THE INVENTION

The present invention relates to a semiconductor assembly and, more particularly, to a semiconductor assembly having dual conduction channels for electricity and heat passage.

DESCRIPTION OF RELATED ART

High voltage or high current applications (e.g. power modules, microprocessors etc.) often require high performance wiring board for chip interconnection. However, as the power increases, a large amount of heat generated by semiconductor chips would degrade device performance and imposes thermal stress on the chips. Ceramic materials, such as alumina or aluminum nitride which is thermally conductive, electrically insulative and low in CTE (Coefficient of Thermal Expansion), are often considered as suitable materials for semiconductor chip interconnect base. Although ceramic has a low CTE which is adequate for semiconductor chip attachment, existing ceramic-based assemblies cannot meet the requirements for high power applications where a large amount of heat needs to be dissipated effectively during operation. Moreover, since it is difficult for the ceramic to form large-size vertically connecting elements therein, this type of assembly is prohibitively unsuitable for certain applications which require vertical transmission of a large amount of electricity.

SUMMARY OF THE INVENTION

An objective of the present invention is to provide a semiconductor assembly with dual conduction channels for electricity and heat passage. The semiconductor assembly is characterized by a top substrate and a base substrate, respectively, having an electrode connection plate and an electrode connection slug that are electrically connected to and thermally conductible with top and bottom electrode layers of a semiconductor device. The electrode connection plate and the electrode connection slug can offer high current flow channels and also ensure high heat flux dissipation for the semiconductor device.

In accordance with the foregoing and other objectives, the present invention provides a semiconductor assembly, comprising a top substrate, a base substrate and a semiconductor device. The top substrate includes an electrode connection plate and a plurality of vertical posts protruding from a substantially planar inner surface of the electrode connection plate. The inner surface of the electrode connection plate provides a first conduction surface for the semiconductor device. The base substrate includes a dielectric layer, an electrode connection slug, a first routing circuitry on a substantially planar first surface of the dielectric layer, and a second routing circuitry on an opposite substantially planar second surface of the dielectric layer. The electrode connection slug is embedded in the dielectric layer and provides a second conduction surface for the semiconductor device, and the first routing circuitry and the second routing circuitry are electrically connected to each other. The semiconductor device includes a first electrode layer at its first surface and a second electrode layer at its opposite second surface. The top substrate is electrically connected to the base substrate using a first soldering material between the vertical posts and the base substrate. Further, the first electrode layer of the semiconductor device is attached to the first conduction surface and is electrically connected to the base substrate through the top substrate and the first soldering material. The second electrode layer of the semiconductor device is superimposed over the second conduction surface and electrically connected to the second routing circuitry through the electrode connection slug and a second soldering material between the second electrode layer of the semiconductor device and the base substrate.

These and other features and advantages of the present invention will be further described and more readily apparent from the detailed description of the preferred embodiments which follows.

BRIEF DESCRIPTION OF THE DRAWINGS

The detailed description of the preferred embodiments of the present invention can best be understood when read in conjunction with the following drawings, in which:

FIG. 1 is a cross-sectional view of a laminate in accordance with the first embodiment of the present invention;

FIGS. 2 and 3 are cross-sectional and top perspective views, respectively, of the structure of FIG. 1 further formed with through openings in accordance with the first embodiment of the present invention;

FIGS. 8, 9 and 10 are cross-sectional, top and bottom plan views, respectively, of the structure of FIGS. 6 and 7 further formed with a first routing circuitry, a second routing circuitry and vertical connecting elements to finish the fabrication of a base substrate in accordance with the first embodiment of the present invention;

DETAILED DESCRIPTION OF THE PREFERRED EMBODIMENTS

Figure 4:
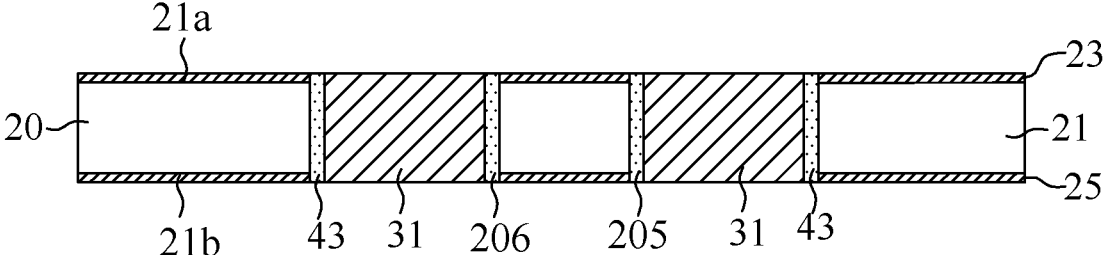
FIGS. 4 and 5 are cross-sectional and top perspective views, respectively, of the structure of FIGS. 2 and 3 further provided with an electrode connection slug and an organic resin binder in accordance with the first embodiment of the present invention.

Hereafter, examples will be provided to illustrate the embodiments of the present invention. The advantages and effects of the invention will become more apparent from the following description of the present invention. It should be noted that the accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-16 are schematic views showing a method of making a semiconductor assembly that includes a base substrate, semiconductor devices, an electronic device, a passive device and a top substrate in accordance with the first embodiment of the present invention.

FIG. 1 is a cross-sectional view of a laminate 20 in accordance with the first embodiment of the present invention. In this embodiment, the laminate 20 includes a dielectric layer 21, a first metal layer 23, and a second metal layer 25. The dielectric layer 21 typically is made of an electrically and thermally insulating organic resin material and may have a thermal conductivity less than 1 W/mK. The first metal layer 23 and the second metal layer 25 are optional and typically unpatterned copper layers on substantially planar first and second surfaces 21a, 21b, respectively, of the dielectric layer 21. Optionally, the laminate 20 may further include glass fibers impregnated in the dielectric layer 21 for enhanced mechanical strength.

FIGS. 2 and 3 are cross-sectional and top perspective views, respectively, of the structure formed with through openings 205 in the laminate 20. The through openings 205 each have interior sidewalls extending through the dielectric layer 21 and the optional first and second metal layers 23 and 25. The through openings 205 of the laminate 20 can be formed by numerous techniques, such as punching, drilling or laser cutting.

Figure 5:
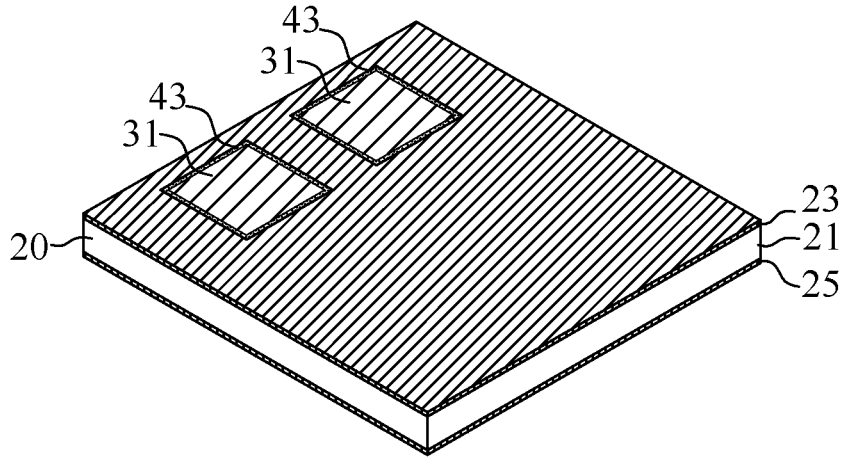

FIGS. 4 and 5 are cross-sectional and top perspective views, respectively, of the structure with electrode connection slugs 31 inserted into the through openings 205 of the laminate 20 and an organic resin binder 43 dispensed in gaps 206 between the laminate 20 and the electrode connection slugs 31. The electrode connection slugs 31 typically are made of an inorganic material and have a thickness of 0.1 mm or more substantially equal to that of the laminate 20. The interior sidewalls of the through openings 205 of the laminate 20 laterally surround and are spaced from peripheral sidewalls of the electrode connection slugs 31. As a result, the gaps 206 are located in the through openings 205 between the interior sidewalls of the laminate 20 and the peripheral sidewalls of the electrode connection slugs 31. The gaps 206 laterally surround the electrode connection slugs 31 and are laterally surrounded by the laminate 20. The organic resin binder 43 fills in the gaps 206 and laterally covers and surrounds and conformally coats the interior sidewalls of the laminate 20 and the peripheral sidewalls of the electrode connection slugs 31. The organic resin binder 43 provides a secure robust mechanical bond between the laminate 20 and the electrode connection slugs 31, and has two opposite surfaces substantially coplanar with the exterior surfaces of the first and second metal layers 23, 25 of the laminate 20 as well as two opposite sides of the electrode connection slugs 31. Preferably, the electrode connection slugs 31 have a thermal conductivity greater than 10 W/mK and an electrical resistivity lower than 0.1 micro ohm m to provide an electrical contact and heat transfer surface for electrical connection and thermal conduction with a semiconductor device (shown in FIG. 11).

Figure 6:
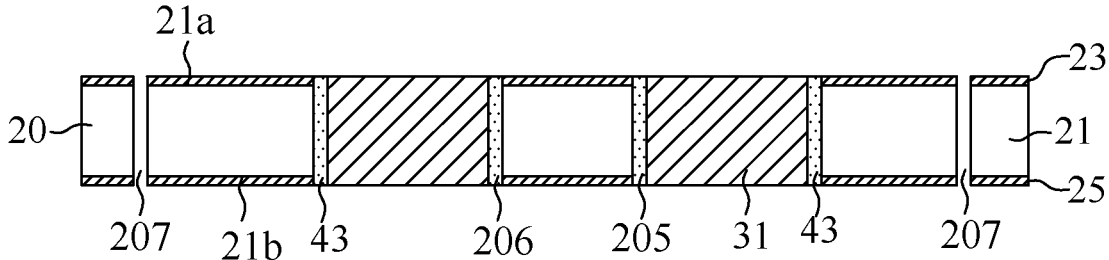
FIGS. 6 and 7 are cross-sectional and top perspective views, respectively, of the structure of FIGS. 4 and 5 further formed with through holes in accordance with the first embodiment of the present invention.
Figure 7:
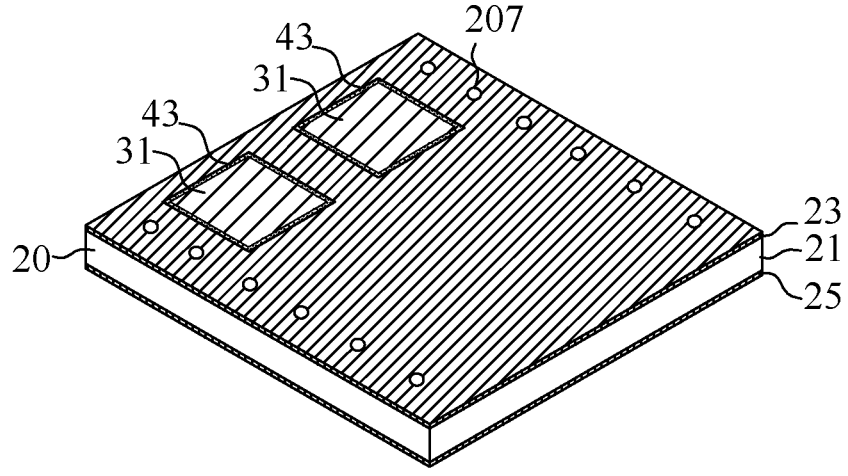

FIGS. 6 and 7 are cross-sectional and top perspective views, respectively, of the structure formed with through holes 207. The through holes 207 can be formed by mechanical drilling or other techniques such as laser drilling and plasma etching with or without wet etching, and extend through the dielectric layer 21 and the optional first and second metal layers 23, 25.

FIGS. 8, 9 and 10 are cross-sectional, top and bottom plan views, respectively, of the structure provided with a first routing circuitry 51 and a second routing circuitry 53. The top and bottom surfaces of the structure can be metallized, followed by a metal patterning process to form the first routing circuitry 51 and the second routing circuitry 53. The first routing circuitry 51 includes selected portions that laterally extend from the first metal layer 23 on the dielectric layer 21 to the top side of each of the electrode connection slugs 31, whereas the second routing circuitry 53 includes selected portions that laterally extend from the second metal layer 25 on the dielectric layer 21 to the bottom side of each of the electrode connection slugs 31. In this illustration, the first routing circuitry 51 and the second routing circuitry 53 further completely cover the organic resin binder 43 between the laminate 20 and the electrode connection slugs 31 as well as interfaces between the laminate 20 and the organic resin binder 43 and between the electrode connection slugs 31 and the organic resin binder 43 from above and below. Also, the through holes 207 are metallized to form conductive through holes as vertical connecting elements 55 extending through the dielectric layer 21 and in contact with the first routing circuitry 51 and the second routing circuitry 53. As a result, the vertical connecting elements 55 can provide electrical connections between the first routing circuitry 51 and the second routing circuitry 53.

The metallization can be executed by numerous techniques, such as electroplating, electroless plating, evaporating, sputtering or their combinations, and typically by electroless plating followed by electroplating to deposit a plated layer on the first metal layer 23 and the second metal layer 25 as well as both sides of the electrode connection slugs 31 and both surfaces of the organic resin binder 43 and into the through holes 207. The metal patterning techniques include wet etching, electro-chemical etching, laser-assisted etching, and their combinations with etch masks (not shown) thereon that define the first routing circuitry 51 and the second routing circuitry 53.

Accordingly, as shown in FIGS. 8, 9 and 10, a base substrate 100 is accomplished and includes a dielectric layer 21, electrode connection slugs 31 adhered to interior sidewalls of the dielectric layer 21 through an organic resin binder 43, a first routing circuitry 51 deposited on a substantially planar first surface 21*a* of the dielectric layer 21, and a second routing circuitry 53 deposited on an opposite substantially planar second surface 21*b* of the dielectric layer 21 and electrically connected to the first routing circuitry 51 through vertical connecting elements 55 in the dielectric layer 21. The dielectric layer 21 laterally covers and surrounds peripheral sidewalls of the electrode connection slugs 31 and is mechanically connected to peripheral sidewalls of the electrode connection slugs 31 by the organic resin binder 43 between the dielectric layer 21 and the electrode connection slugs 31. The electrode connection slugs 31 are thermally conductible with and electrically connected to the first routing circuitry 51 and the second routing circuitry 53. The first routing circuitry 51 and the second routing circuitry 53 laterally extend on the first surface 21*a* and the second surface 21*b* of the dielectric layer 21 from above and below, respectively, to provide horizontal routing, and further are electrically coupled to the vertical connecting elements 55 that provide vertical routing.

Figure 11:
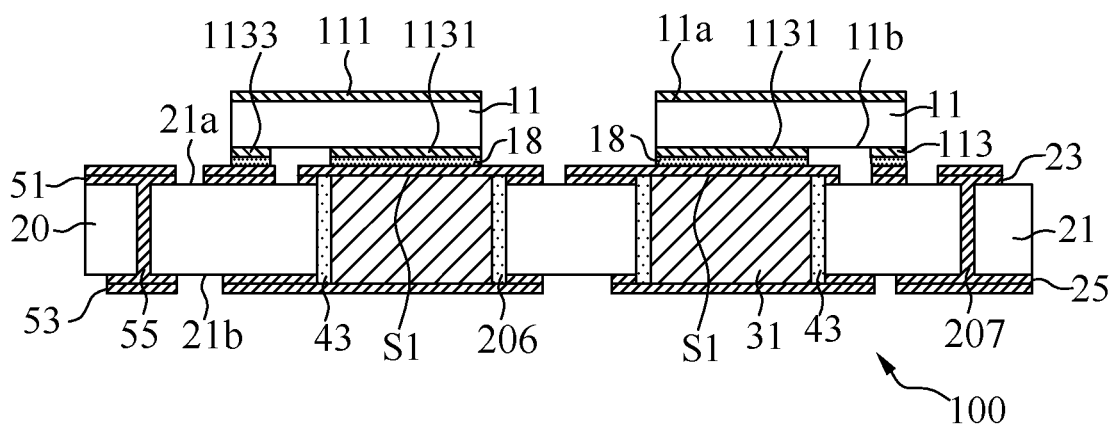
FIGS. 11 and 12 are cross-sectional and top plan views, respectively, of the structure of FIGS. 8, 9 and 10 further provided with semiconductor devices, an electronic component and a passive component in accordance with the first embodiment of the present invention.
Figure 12:
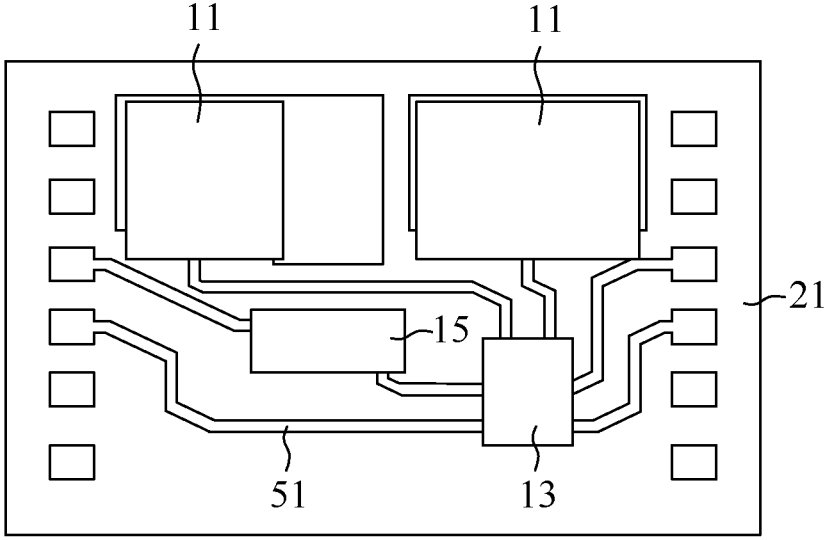

FIGS. 11 and 12 are cross-sectional and top plan views, respectively, of the structure provided with semiconductor devices 11, an electronic component 13 and a passive component 15 attached on and electrically connected to the base substrate 100 illustrated in FIGS. 8, 9 and 10 using soldering material 18. The electrode connection slugs 31 of the base substrate 100 each have a selected substantially planar and continuous surface completely overlapped by the soldering material 18 and defined as a conduction surface S1 for electrical and thermal conduction with its respective semiconductor device 11. Preferably, the conduction surface S1 of each the electrode connection slugs 31 has an area of 0.1 mm² or more for desired electrical and thermal conduction efficiency. The semiconductor devices 11 may be power semiconductor devices (e.g. vertical power chips) and each includes a first electrode layer 111 at its first surface 11*a* and a second electrode layer 113 at its opposite second surface 11*b*. The second electrode layer 113 of each of the semiconductor devices 11 includes at least one bottom contact pad 1131 (e.g. bottom I/O pad) superimposed over the conduction surface S1 of the respective electrode connection slug 31. The bottom contact pad 1131 of each of the semiconductor devices 11 is electrically connected to and thermally conductible with the respective electrode connection slug 31 of the base substrate 100 through the soldering material 18 between the second electrode layer 113 and the electrode connection slug 31. In this illustration, as the first routing circuitry 51 and the second routing circuitry 53 have selected portions in contact with the electrode connection slugs 31, the bottom contact pad 1331 of each of the semiconductor devices 11 is electrically connected to the second routing circuitry 53 through the soldering material 18, the first routing circuitry 51 and the electrode connection slug 31. Further, the second electrode layer 113 of each of the semiconductor devices 11 may also include an additional bottom contact pad 1133 superimposed over the dielectric layer 21 of the base substrate 100 and electrically connected to the first routing circuitry 51 on the dielectric layer 21 through the soldering material 18 in contact with the first routing circuitry 51 and the second electrode layer 13. Also shown in FIG. 12, the electronic component 13 and the passive component 15 are superimposed over the dielectric layer 21 of the base substrate 100 and electrically connected to the first routing circuitry 51 on the dielectric layer 21. By the electrical connection between the first routing circuitry 51 and the second routing circuitry 53 through the vertical connecting elements 55 and between the first routing circuitry 51 and the semiconductor devices 11/the electronic component 13/the passive component 15, the additional bottom contact pad 1133 of the semiconductor devices 11 can be interconnected with the electronic component 13 and the passive component 15 and further electrically connected to the second routing circuitry 53.

The soldering material 18 typically has a thermal conductivity greater than 10 W/mK and an electrical resistivity less than 1 micro ohm meter. As no thermal barrier material having a thermal conductivity less than 1 W/mK is present between the conduction surface S1 of the electrode connection slug 31 and the second electrode layer 113 of the semiconductor device 11, the heat generated by the semiconductor devices 11 can be efficiently transferred to and spread out to the electrode connection slugs 31. Also, the configuration where there is no electrically insulative material between the conduction surface S1 and the second electrode layer 113 can facilitate a high current flow between the semiconductor device 11 and the base substrate 100.

Figure 13:
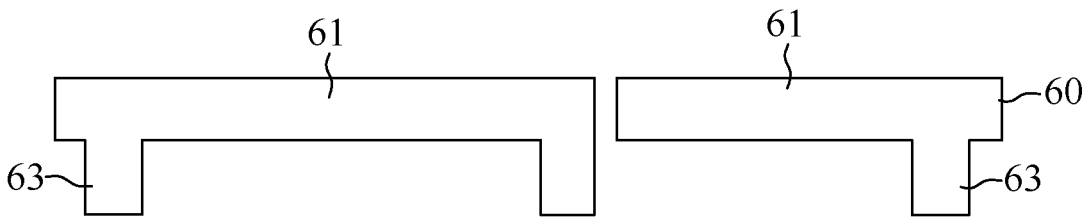
FIGS. 13 and 14 are cross-sectional and bottom perspective views, respectively, of a top substrate in accordance with the first embodiment of the present invention.
Figure 14:
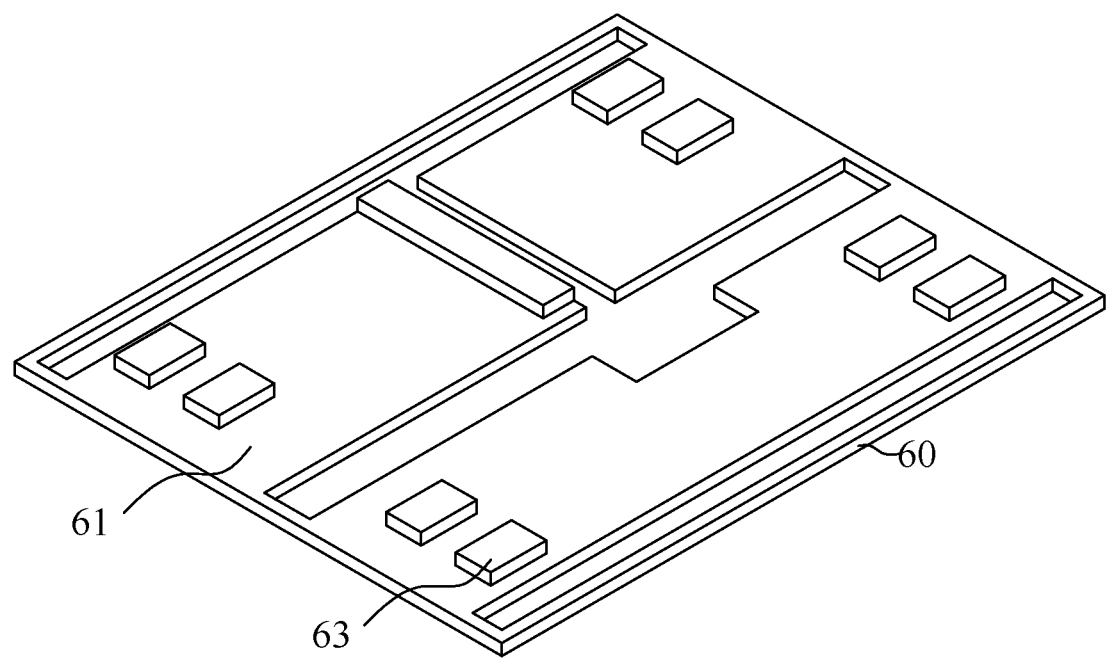

FIGS. 13 and 14 are cross-sectional and bottom perspective views, respectively, of a top substrate 60. The top substrate 60 can be patterned by, for example, an etching process, and thus includes an electrode connection plate 61 and a plurality of vertical posts 63. The electrode connection plate 61 can have a thickness of no less than 0.1 mm. The vertical posts 63 contact and protrude from a substantially planar inner surface of the electrode connection plate 61. The electrode connection plate 61 and the vertical posts 63 can be made of an inorganic material and typically have a thermal conductivity greater than 10 W/mK and an electrical resistivity less than 0.1 u ohm m.

Figure 15:
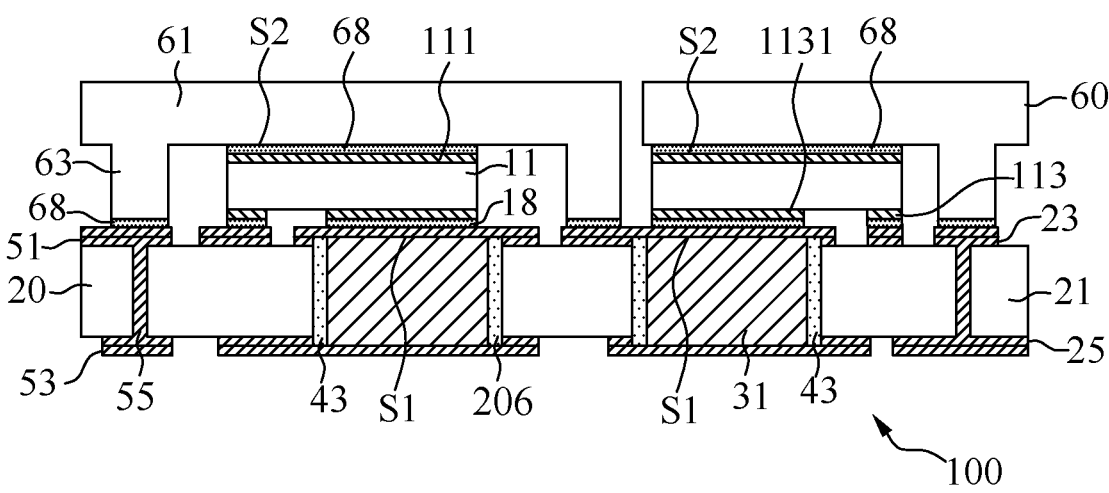
FIGS. 15 and 16 are cross-sectional and top perspective views, respectively, of a semiconductor assembly with the top substrate of FIGS. 13 and 14 mounted on the structure of FIGS. 11 and 12 in accordance with the first embodiment of the present invention.
Figure 16:
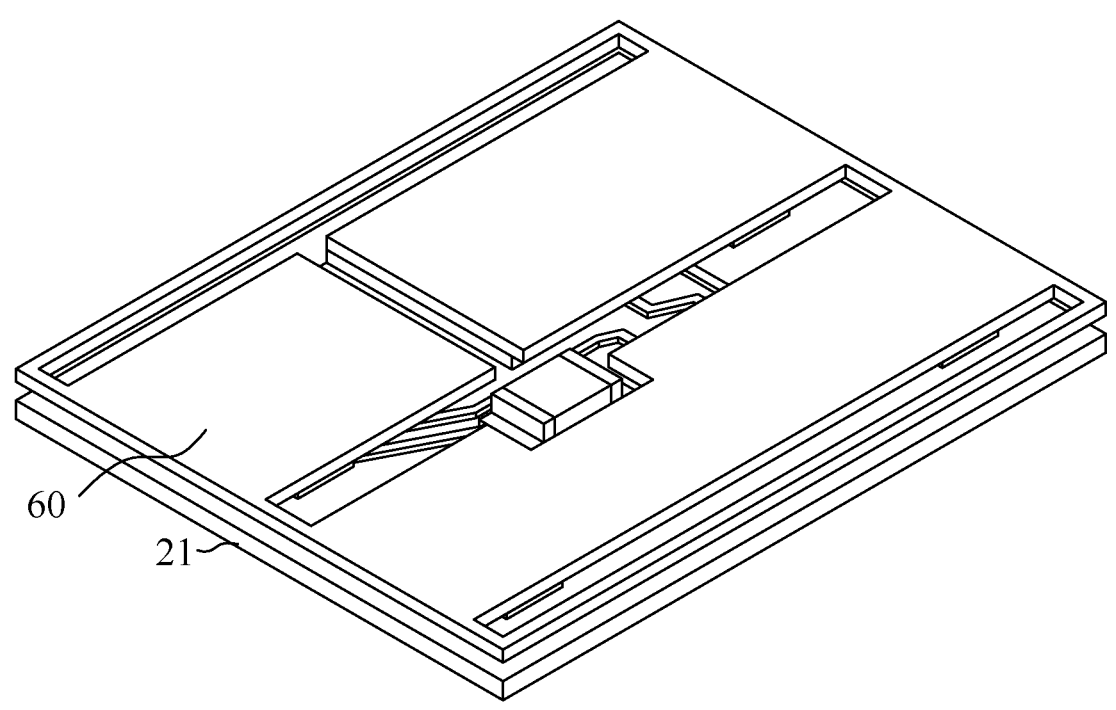

FIGS. 15 and 16 are cross-sectional and top perspective views, respectively, of a semiconductor assembly with the top substrate 60 of FIGS. 13 and 14 mounted to the structure of FIGS. 11 and 12. The top substrate 60 is attached to the semiconductor devices 11 and the base substrate 100 using soldering material 68 between the electrode connection plate 61 and the semiconductor devices 11 and between the vertical posts 63 and the base substrate 100. The electrode connection plate 61 has a selected substantially planar and continuous surface in contact with the soldering material 68 and defined as a conduction surface S2 in electrical and thermal conduction with the respective semiconductor device 11. The soldering material 68 typically has a thermal conductivity greater than 10 W/mK and an electrical resistivity less than 1 u ohm m. for good thermal and electrical performance of the assembly, and contacts the conduction surface S2 of the electrode connection plate 61, the first electrode layers 111 of the semiconductor devices 11, the vertical posts 63 of the top substrate 60 and the first routing circuitry 51 of the base substrate 100. As a result, the electrode connection plate 61 of the top substrate 60 is electrically connected to and thermally conductible to the first electrode layer 111 of the respective semiconductor devices 11 and to the first routing circuitry 51 of the base substrate 100 through the vertical posts 63. Preferably, the conduction surface S2 of the electrode connection plate 61 has an area of 1 mm$^2$ or more, and there is no electrically insulative material or thermal barrier material with a thermal conductivity less than 1 W/mK present between the conduction surface S2 of the electrode connection plate 61 and the semiconductor devices 11 so as to ensure high current flow and good heat dissipation for the semiconductor devices 11. Also, there is no thermal barrier material between the vertical posts 63 and the first routing circuitry 51 of the base substrate 100.

Figure 17:
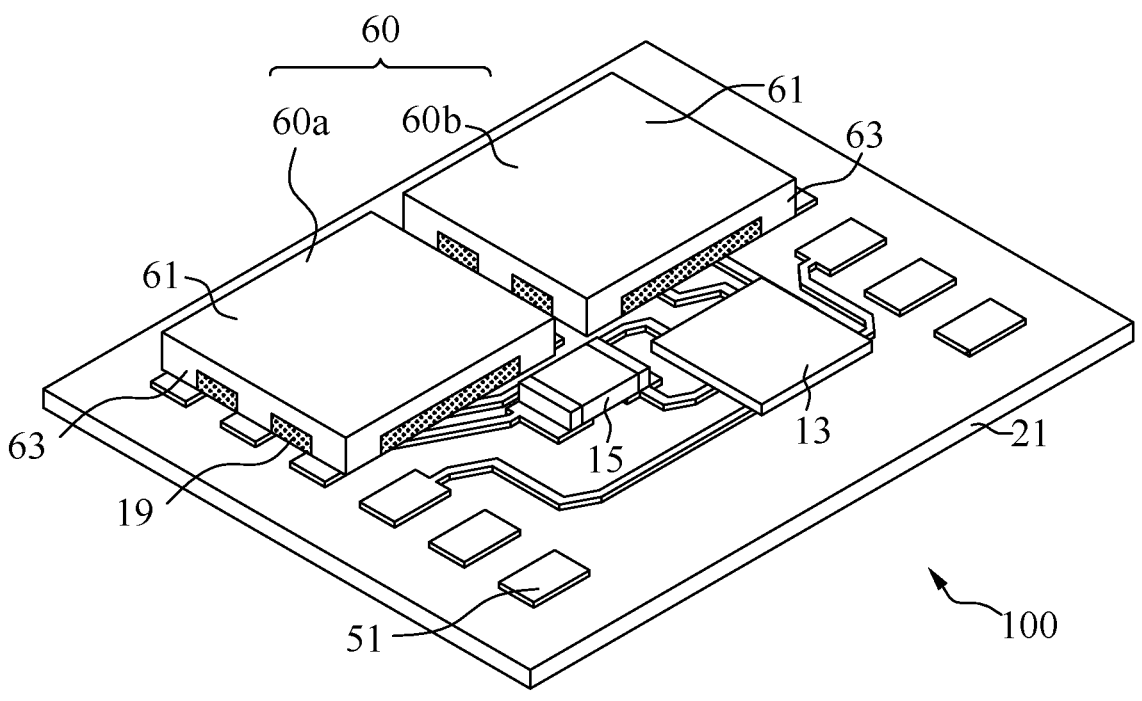
FIG. 17 is a top perspective view of another aspect of the semiconductor assembly in accordance with the first embodiment of the present invention.

FIG. 17 is a top perspective view of another aspect of the semiconductor assembly in accordance with the first embodiment of the present invention. The semiconductor assembly is similar to that illustrated in FIG. 15, except that the top substrate 60 has dispersed leads 60a, 60b and optionally an encapsulant material 19 fills up remaining spaces within the top substrate 60. Each of the dispersed leads 60a, 60b includes an electrode connection plate 61 and vertical posts 63. The separate electrode connection plates 61 are attached to their respective semiconductor devices, while the vertical posts 63 are attached to the first routing circuitry 51. By the encapsulant material 19 filled in remaining spaces within the dispersed leads 60a, 60b, the semiconductor devices can be protected from negative effect of ambient moisture and others.

Embodiment 2

Figure 18:
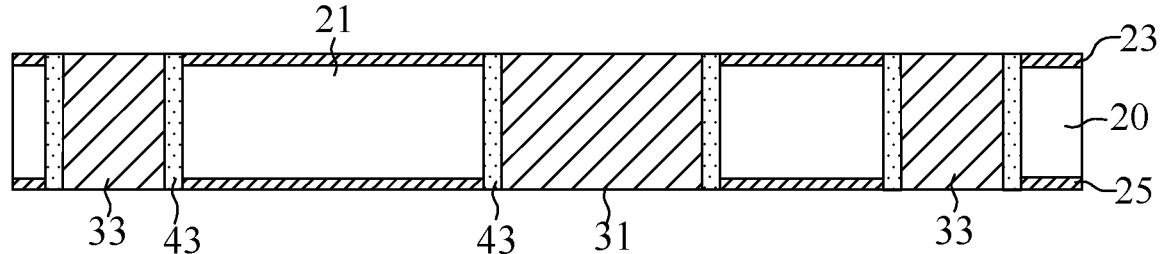
FIG. 18 is a cross-sectional view of the structure having an electrode connection slug and vertical pillars retained in a laminate using an organic resin binder in accordance with the second embodiment of the present invention.
Figure 19:
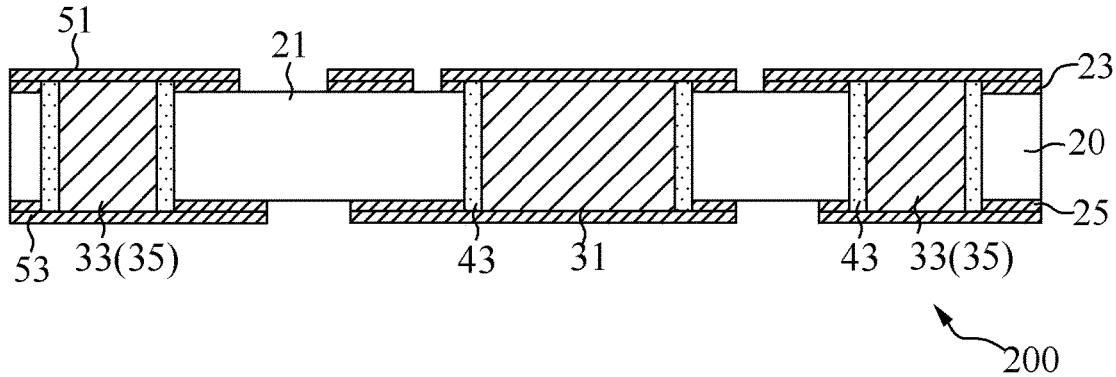
FIG. 19 is a cross-sectional view of a base substrate with the structure of FIG. 18 further provided with a first routing circuitry and a second routing circuitry in accordance with the second embodiment of the present invention.
Figure 20:
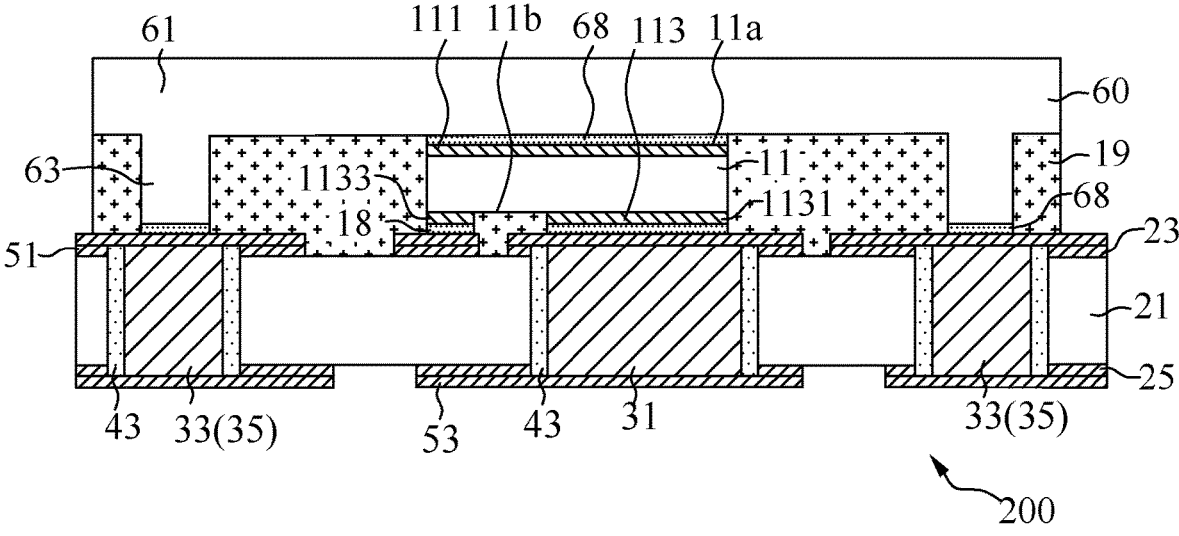
FIG. 20 is a cross-sectional view of a semiconductor assembly with the structure of FIG. 19 further provided with a semiconductor device, a top substrate and an optional encapsulant material in accordance with the second embodiment of the present invention.

FIGS. 18-20 are cross-sectional views showing a method of making a semiconductor assembly in accordance with the second embodiment of the present invention. For purposes of brevity, any description in Embodiment 1 is incorporated herein insofar as the same is applicable, and the same description need not be repeated.

FIG. 18 is a cross-sectional view of the structure with an electrode connection slug 31 and vertical pillars 33 embedded in a laminate 20 and organic resin binder 43 dispensed in gaps between the peripheral sidewalls of the electrode connection slug 31 and the interior sidewalls of the laminate 20 and between the peripheral sidewalls of the vertical pillars 33 and the interior sidewalls of the laminate 20. The vertical pillars 33 each have two opposite sides substantially coplanar with the exterior surfaces of the first and second metal layers 23, 25 of the laminate 20 and the two opposite sides of the electrode connection slug 31 as well as the two opposite surfaces of the organic resin binder 43.

FIG. 19 is a cross-sectional view of a base substrate 200 with a first routing circuitry 51 and a second routing circuitry 53 on the two opposite sides of the dielectric layer 21, respectively. The first routing circuitry 51 includes selected portions that laterally extend from the first metal layer 23 on the dielectric layer 21 to the top side of the electrode connection slug 31, and additional selected portions that laterally extend from the first metal layer 23 on the dielectric layer 21 to the top side of each of the vertical pillars 33. The second routing circuitry 53 includes selected portions that laterally extend from the second metal layer 25 on the dielectric layer 21 to the bottom side of the electrode connection slug 31, and additional selected portions that laterally extend from the second metal layer 25 on the dielectric layer 21 to the bottom side of each of the vertical pillars 33. As a result, the vertical pillars 33 can be used as vertical connecting elements 35 for electrical connection between the first routing circuitry 51 and the second routing circuitry 53. In this illustration, the first routing circuitry 51 and the second routing circuitry 53 further completely cover the organic resin binder 43 between the laminate 20 and the electrode connection slug 31 and between the laminate 20 and the vertical connecting elements 35 as well as interfaces between the laminate 20 and the organic resin binder 43 and between the electrode connection slug 31 and the organic resin binder 43 and between the vertical connecting elements 35 and the organic resin binder 43 from above and below, respectively.

FIG. 20 is a cross-sectional view of a semiconductor assembly with a semiconductor device 11 and a top substrate 60 mounted on the base substrate 200. The semiconductor device 11 includes a first electrode layer 111 at its first surface 11a and a second electrode layer 113 at its opposite second surface 11b. The second electrode layer 113 of the semiconductor device 11 includes bottom contact pads 1131, 1133 superimposed over the electrode connection slug 31 and the dielectric layer 21, respectively, and thermal conductible with and electrically connected to the base substrate 200 using soldering material 18. The top substrate 60 includes an electrode connection plate 61 and vertical posts 63 integrated as one single piece, and is attached to the semiconductor device 11 and the base substrate 200 using soldering material 68. The first electrode layer 111 of the semiconductor device 11 is thermal conductible with and electrically connected to the electrode connection plate 61 of the top substrate 60 through the soldering material 68. The vertical pillars 63 of the top substrate 60 protrude from a substantially planar inner surface of the electrode connection plate 61 and are electrically connected to the first routing circuitry 51 through the soldering material 68. As a result, the first electrode layer 111 of the semiconductor device 11 can be electrically connected to the second routing circuitry 53 through the top substrate 60, the soldering material 68, the first routing circuitry 51 and the vertical connecting elements 35, whereas the second electrode layer 113 of the semiconductor device 11 can be electrically connected to the second routing circuitry 53 through the soldering material 18, the first routing circuitry 51 and the electrode connection slug 31. Also, the electrode connection slug 31 and the top substrate 60 can provide dual heat conduction channels for the semiconductor device 11. Optionally, an encapsulant material 19 may be dispensed in the remaining spaces within the top substrate 60.

Embodiment 3

FIGS. 21-24 are schematic views showing a method of making a semiconductor assembly in accordance with the third embodiment of the present invention. For purposes of brevity, any description in above Embodiments is incorporated herein insofar as the same is applicable, and the same description need not be repeated.

Figure 21:
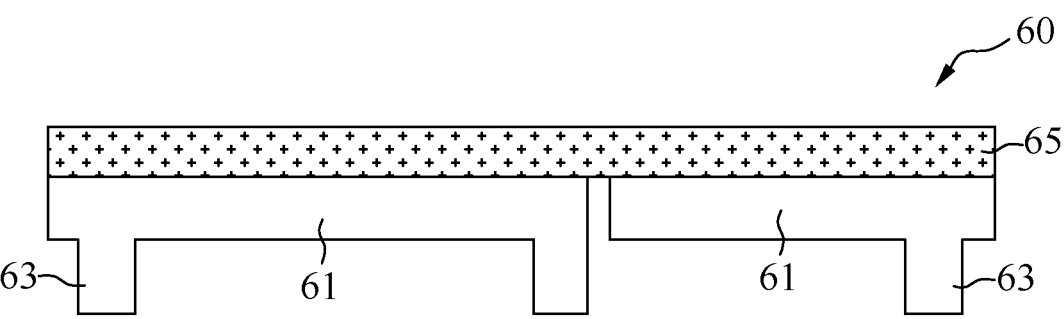
FIGS. 21 and 22 are cross-sectional and bottom perspective views, respectively, of a top substrate in accordance with the third embodiment of the present invention.
Figure 22:
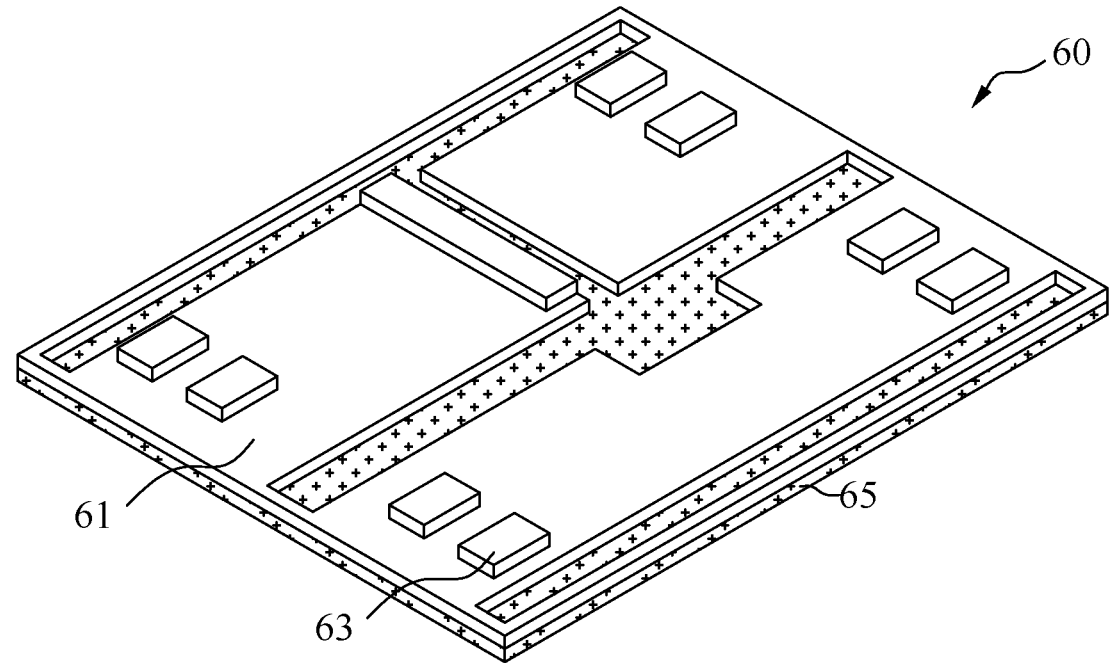

FIGS. 21 and 22 are cross-sectional and bottom perspective views, respectively, of a top substrate 60. The top substrate 60 is similar to that illustrated in FIGS. 13 and 14, except that it further includes a flatness control layer 65 on a substantially planar outer surface of the electrode connection plate 61. The flatness control layer 65 typically has a thickness range of 0.050 mm to 0.5 mm (its nominal thickness can be around 0.25 mm), and may be made of an organic resin material with fillers therein or a laminate material with glass fibers impregnated in the resin. Accordingly, the flatness control layer 65 can be used to ensure the flatness of the top substrate 60. Further, when the top substrate 60 includes dispersed leads, the flatness control layer 65 is very crucial to maintain the integrity of the leads especially during cutting/singulation for keeping all the leads in place. Also, the flatness control layer 65 can serve as an insulating layer for the leads of the top substrate 60.

Figure 23:
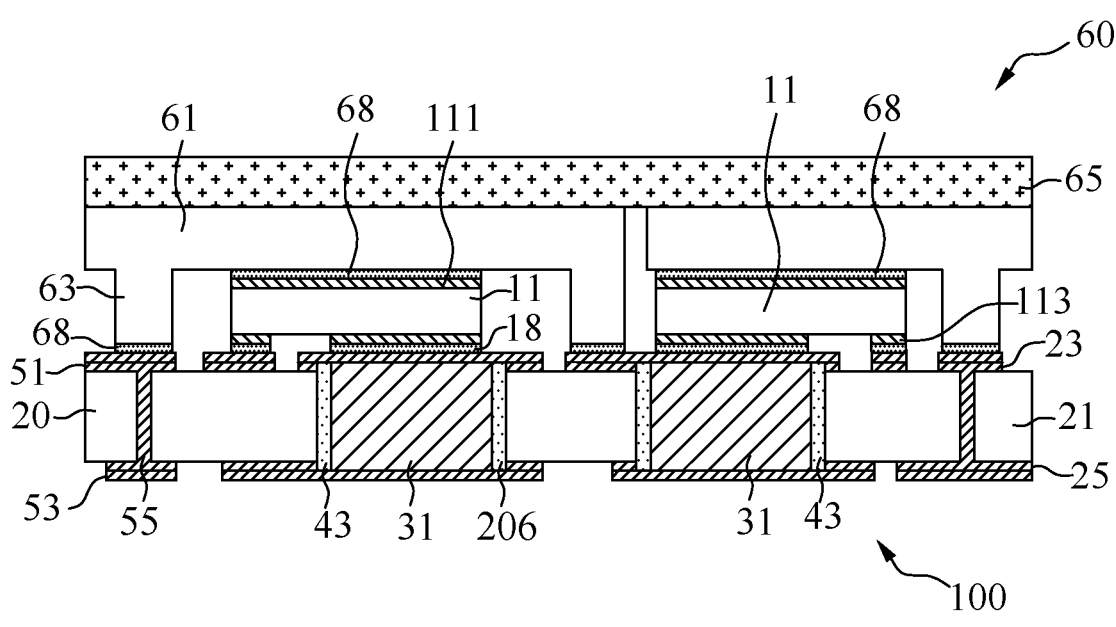
FIGS. 23 and 24 are cross-sectional and top perspective views, respectively, of a semiconductor assembly with the top substrate of FIGS. 21 and 22 mounted on the structure of FIGS. 11 and 12 in accordance with the third embodiment of the present invention.
Figure 24:
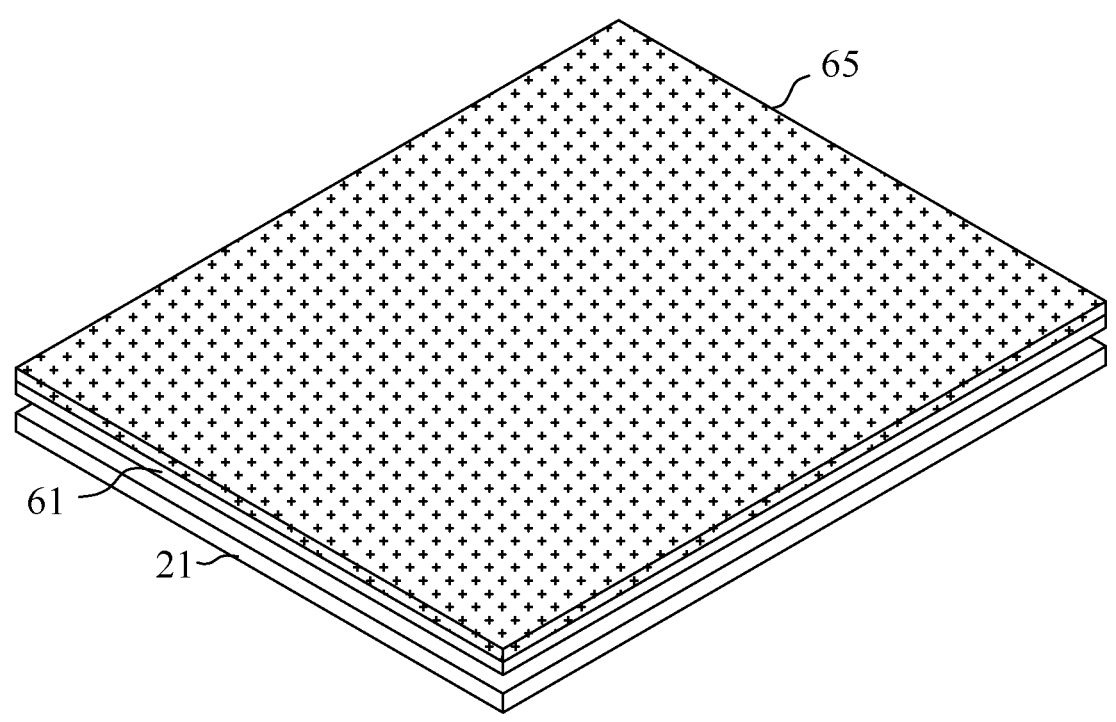

FIGS. 23 and 24 are cross-sectional and top perspective views, respectively, of a semiconductor assembly with the top substrate 60 of FIGS. 21 and 22 mounted to the structure of FIGS. 11 and 12. The electrode connection plate 61 and the vertical posts 63 of the top substrate 60 are thermally conductible with and electrically connected to the first electrode layers 111 of the semiconductor devices 11 and the first routing circuitry 51 of the base substrate 100 using soldering material 68, respectively. Further, the second electrode layers 113 of the semiconductor devices 11 are thermally conductible with and electrically connected to the electrode connection slugs 31 and the first routing circuitry 51 of the base substrate 100 using soldering material 18.

Embodiment 4

Figure 25:
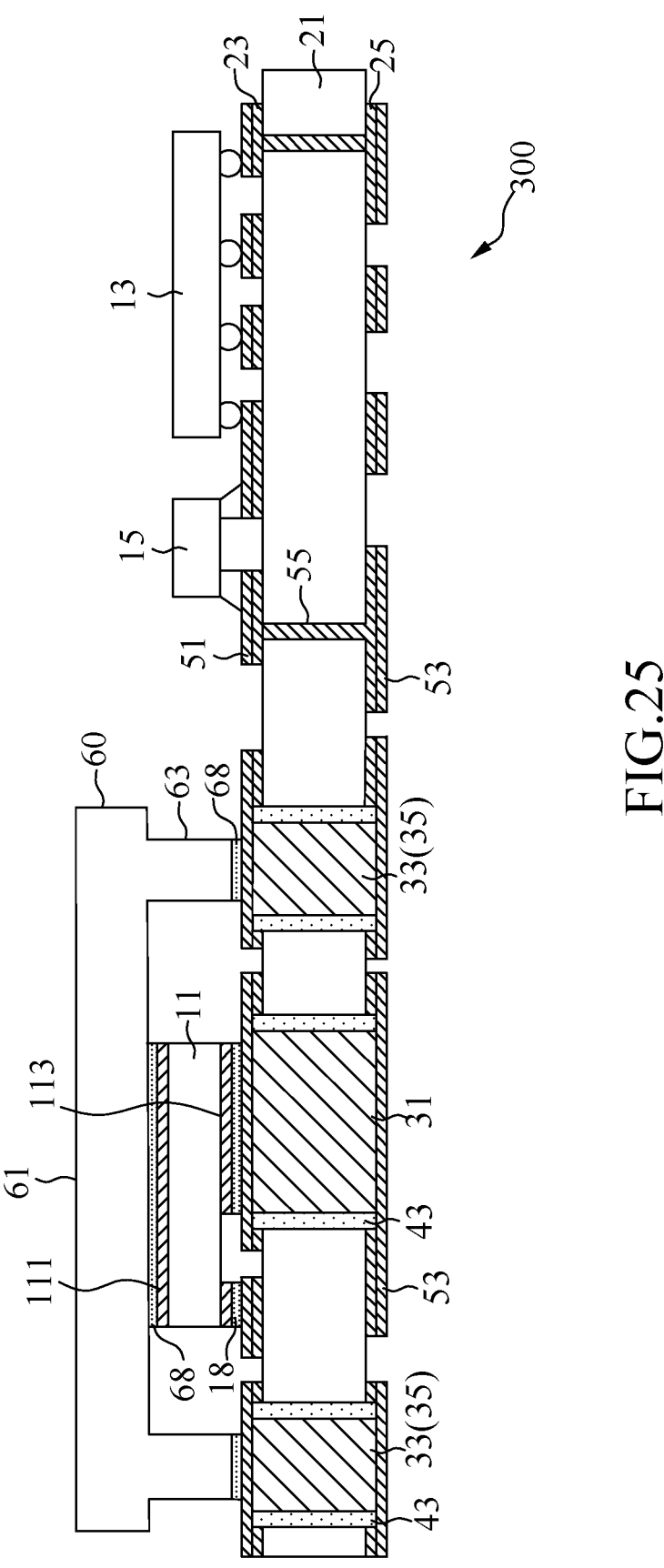
FIG. 25 is a cross-sectional view of a semiconductor assembly in accordance with the fourth embodiment of the present invention.

FIG. 25 is a cross-sectional view of a semiconductor assembly in accordance with the fourth embodiment of the present invention. For purposes of brevity, any description in above Embodiments is incorporated herein insofar as the same is applicable, and the same description need not be repeated.

The semiconductor assembly of this embodiment includes a semiconductor device 11, an electronic component 13, a passive component 15, a base substrate 300 and a top substrate 60. The base substrate 300 is similar to the base substrate 200 illustrated in FIG. 20, except that the base substrate 300 further includes conductive through holes as additional vertical connecting elements 55 for electrical connection between the first routing circuitry 51 and the second routing circuitry 53. The semiconductor device 11 is thermally conductible with and electrically connected to an electrode connection plate 61 of the top substrate 60 using soldering material 68 in contact with a first electrode layer 111 of the semiconductor device 11 and an electrode connection plate 61 of the top substrate 60. Further, the semiconductor device 11 is also thermally conductible with and electrically connected to the electrode connection slug 31 of the bottom substrate 300 using soldering material 18 in contact with a second electrode layer 113 of the semiconductor device 11 and base substrate 300. By vertical posts 63 of the top substrate 60 attached to the base substrate 300 using soldering material 68, the first electrode layer 111 of the semiconductor device 11 is further electrically connected to the second routing circuitry 53 through the electrode connection plate 61, the vertical posts 63, the soldering material 68, the first routing circuitry 51 and the vertical connecting elements 35. Also, the electronic component 13 and the passive component 15 are electrically connected to the second routing circuitry 53 through the first routing circuitry 51 and the vertical connecting elements 55.

Embodiment 5

Figure 26:
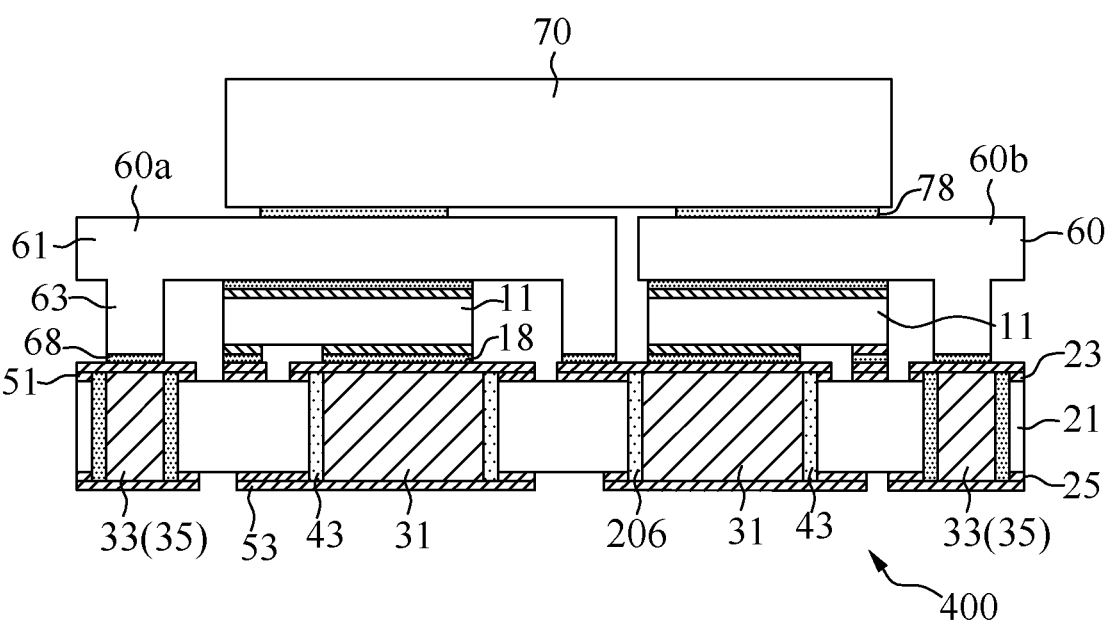
FIG. 26 is a cross-sectional view of a semiconductor assembly in accordance with the fifth embodiment of the present invention.

FIG. 26 is a cross-sectional view of a semiconductor assembly in accordance with the fifth embodiment of the present invention. For purposes of brevity, any description in above Embodiments is incorporated herein insofar as the same is applicable, and the same description need not be repeated.

The semiconductor assembly of this embodiment includes semiconductor devices 11, a base substrate 400, a top substrate 60 and an additional device 70. The base substrate 400 is similar to the base substrate 100 illustrated in FIG. 15, except that vertical pillars 33 are used instead of conductive through holes to serve as vertical connecting elements 35 between the first routing circuitry 51 and the second routing circuitry 53. The semiconductor devices 11 are thermally conductible with and electrically connected to an electrode connection plate 61 of the top substrate 60 and the electrode connection slugs 31 of the base substrate 400. In this illustration, the top substrate 60 has dispersed leads 60*a*, 60*b* attached to their respective semiconductor devices 11 and is further electrically connected to the first routing circuitry 51 of the base substrate 400 through vertical posts 63 of the top substrate 60. The additional device 70 may be a packaged or unpackaged chip (such as a bare chip, or a wafer level packaged die and the like) and is attached to the dispersed leads 60*a*, 60*b* of the top substrate 60 using soldering material 78 in contact with the additional device 70 and the substantially planar outer surface of the electrode connection plates 61. The soldering material 78 typically have a thermal conductivity greater than 10 W/mK and an electrical resistivity less than 1 micro ohm meter. As a result, the additional device 70 can be electrically connected to the second routing circuitry 53 of the base substrate 400 through the top substrate 60, the first routing circuitry 51 and the vertical connecting elements 35.

Embodiment 6

Figure 27:
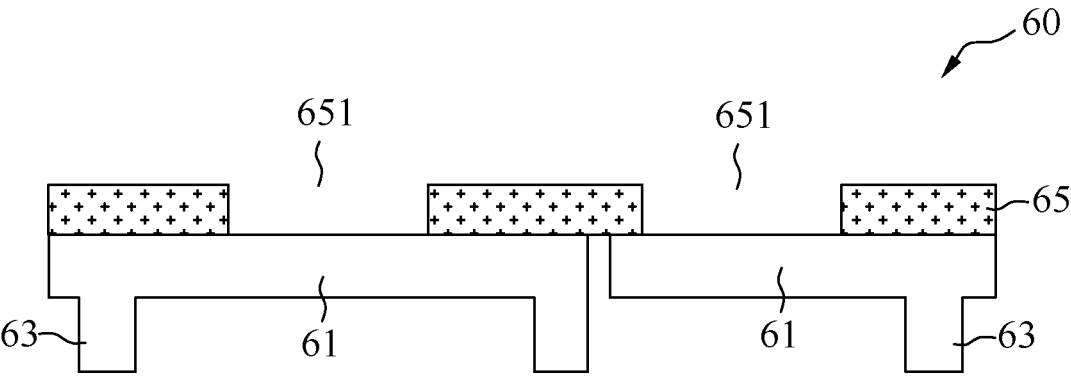
FIGS. 27 and 28 are cross-sectional and top perspective views, respectively, of a top substrate in accordance with the sixth embodiment of the present invention.
Figure 28:
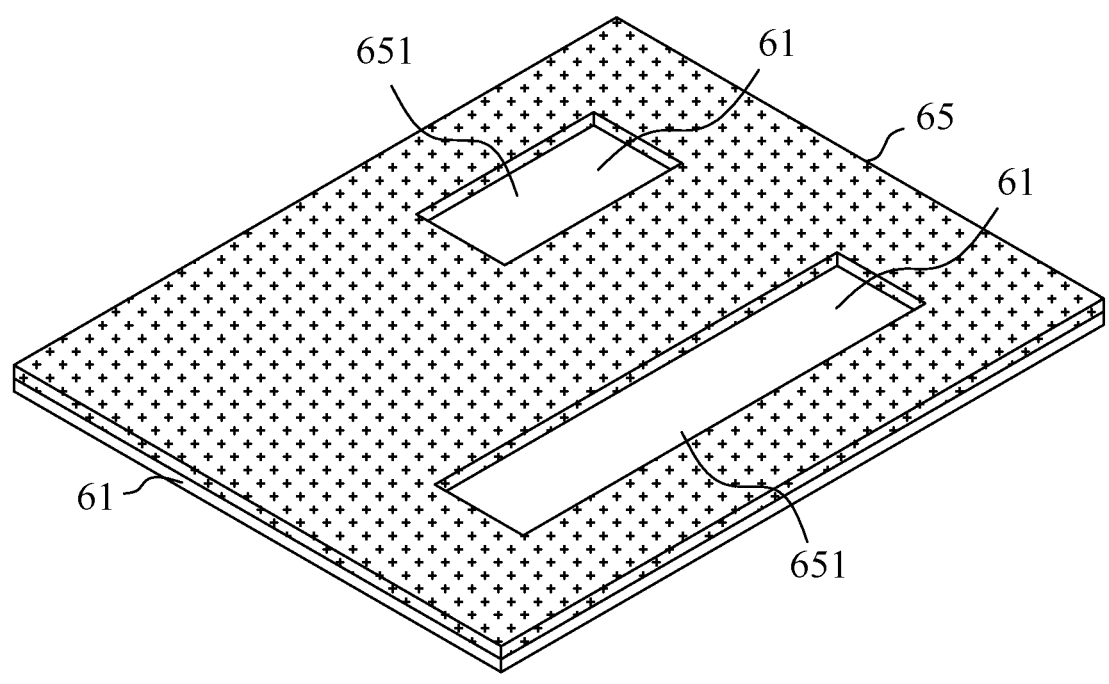
Figure 29:
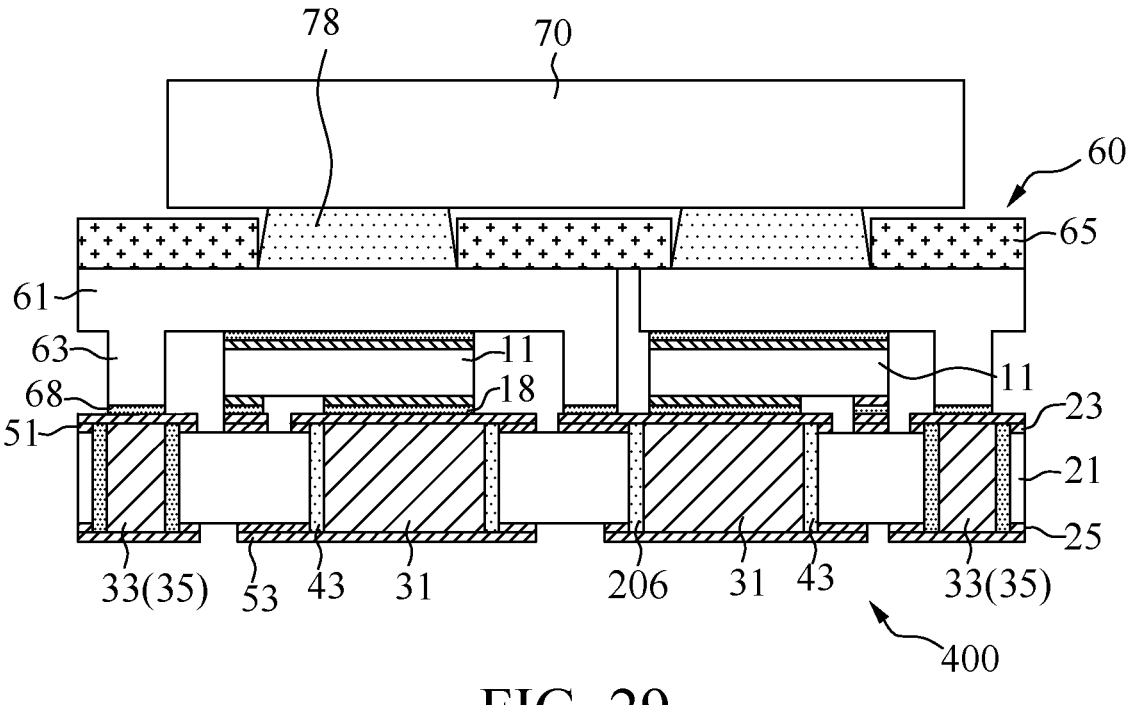
FIG. 29 is a cross-sectional view of a semiconductor assembly with the top substrate in the structure of FIG. 26 replaced by the top substrate of FIGS. 27 and 28 in accordance with the sixth embodiment of the present invention.

FIGS. 27-29 are schematic views showing a method of making a semiconductor assembly in accordance with the sixth embodiment of the present invention. For purposes of brevity, any description in above Embodiments is incorporated herein insofar as the same is applicable, and the same description need not be repeated.

FIGS. 27 and 28 are cross-sectional and top perspective views, respectively, of a top substrate 60. The top substrate 60 is similar to that illustrated in FIGS. 21 and 22, except that openings 651 are formed through the flatness control layer 65. As a result, selected portions of the electrode connection plate 61 are exposed from the openings 651 of the flatness control layer 65 from above to provide electrical contacts for subsequent device attachment.

FIG. 29 is a cross-sectional view of a semiconductor assembly similar to that illustrated in FIG. 26 except that the top substrate 60 of FIGS. 27 and 28 is used instead of that illustrated in FIG. 26. The additional device 70 is located above the flatness control layer 65 and electrically coupled to the electrode connection plate 61 using soldering material 78 within the openings 651.

As illustrated in the aforementioned embodiments, a distinctive semiconductor assembly is configured to exhibit improved thermal and electrical performance, in which a semiconductor device (e.g. a vertical power device) is soldered to a base substrate having an electrode connection slug under a bottom contact pad of the semiconductor device while a top substrate is soldered to the base substrate and to a top contact pad of the semiconductor device. Optionally, the semiconductor assembly may further include an additional device stacked on and electrically connected to the top substrate using soldering material. The top substrate, base substrate and assemblies described above are merely exemplary. Numerous other embodiments are contemplated. In addition, the embodiments described above can be mixed-and-matched with one another and with other embodiments depending on design and reliability considerations.

The top substrate includes an electrode connection plate attached to the semiconductor device and vertical posts attached to the base substrate. The electrode connection plate preferably has a thermal conductivity greater than 10 W/mK and an electrical resistivity less than 0.1 u ohm m. As a result, the electrode connection plate not only can be used for electrical connection with a first electrode layer of the semiconductor device, but also can offer locally high heat conduction channel for the semiconductor device. The electrode connection plate has a selected substantially planar and continuous surface in contact with a soldering material between the semiconductor device and the top substrate and defined as a first conduction surface for good electrical and thermal conduction with the semiconductor device. Preferably, the electrode connection plate has a thickness of 0.1 mm or more and the first conduction surface thereof has an area of 1 mm² or more so as to exhibit high current flow and high heat flux dissipation favorable to more efficient heat spreading. The vertical posts protrude from a substantially planar inner surface (which has a selected portion defined as the first conduction surface) of the electrode connection plate and may be integrated with the electrode connection plate as one single piece. Optionally, the top substrate may further include a flatness control layer on a substantially planar outer surface (which is opposite to the substantially planar inner surface) of the electrode connection plate to ensure the flatness of the top substrate and maintain the integrity of separate portions (e.g. dispersed leads), if present, of the top substrate. The flatness control layer may have a thickness range of 0.050 mm to 0.5 mm, and typically has a nominal thickness of around 0.25 mm. In order to serve as an insulating layer for the leads of the top substrate and provide desired mechanical strength, the flatness control layer may include an insulating resin and fillers dispersed in the resin or fibers (e.g. glass fibers) impregnated in the resin. Additionally, the flatness control layer may have openings to accommodate soldering material in contact with the separate electrode connection plates and the additional device stacked over the flatness control layer.

The base substrate includes a dielectric layer around the electrode connection slug and first and second routing circuitries respectively on both opposite surfaces of the dielectric layer. Optionally, the base substrate may further include glass fibers impregnated in the dielectric layer. The electrode connection slug preferably has a thermal conductivity greater than 10 W/mK and an electrical resistivity less than 0.1 u ohm m. As a result, the electrode connection slug not only can be used for electrical connection with a second electrode layer of the semiconductor device, but also can offer another locally high heat conduction channel for the semiconductor device. The electrode connection slug has a selected substantially planar and continuous surface completely overlapped by soldering material between the semiconductor device and the electrode connection slug and defined as a second conduction surface for good electrical and thermal conduction with the semiconductor device. Preferably, the electrode connection slug has a thickness of 0.1 mm or more and the second conduction surface thereof defined under a solder-joint region has an area of 0.1 mm² or more so as to exhibit high current flow and high heat flux dissipation favorable to more efficient heat spreading. The first routing circuitry extends laterally on a substantially planar first surface of the dielectric layer, and may further extend laterally onto the second conduction surface of the electrode connection slug. Likewise, the second routing circuitry extends laterally on a substantially planar second surface of the dielectric layer, and may further extend laterally onto the bottom surface (opposite to the second conduction surface) of the electrode connection slug. The first routing circuitry and the second routing circuitry can be electrically connected to each other by, for example, vertical pillars, conductive through holes or a combination thereof as vertical connecting elements laterally surrounded by the dielectric layer.

The semiconductor device may be a packaged or unpackaged chip (e.g. a packaged or unpackaged power chip), and includes a first electrode layer at a first surface thereof and a second electrode layer at an opposite second surface thereof. The first electrode layer of the semiconductor device is attached to the first conduction surface of the top substrate using soldering material, while the second electrode layer of the semiconductor device is attached to the second conduction surface of the base substrate using soldering material. Accordingly, heat generated by the semiconductor device can be efficiently transferred to and spread out to the top substrate and the base substrate as dual heat conduction channels for the semiconductor device. Further, by additional soldering material provided between the vertical posts of the top substrate and the first routing circuitry of the base substrate, the first electrode layer of the semiconductor device can be further electrically connected to the base substrate through the top substrate and the additional soldering material. On the other hand, the second electrode layer of the semiconductor device can have a selected portion superimposed over the second conduction surface and electrically connected to the second routing circuitry through the electrode connection slug and the soldering material between the second electrode layer of the semiconductor device and the base substrate.

The soldering materials between the semiconductor device and the top substrate, between the semiconductor device and the base substrate, between the top substrate and the base substrate and between the top substrate and the additional device stacked over the top substrate preferably have a thermal conductivity greater than 10 W/mK and an electrical resistivity less than 1 u ohm m. Accordingly, there is no electrically insulative or thermal barrier material with a thermal conductivity less than 1 W/mK present between the first conduction surface of the top substrate and the first electrode layer of the semiconductor device and between the second conduction surface of the base substrate and the second electrode layer of the semiconductor device so as to ensure good electrical and thermal performance of the assembly.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips. The chip can be a packaged or unpackaged chip. Furthermore, the chip can be a bare chip, or a wafer level packaged die, etc.

The term "cover" refers to incomplete or complete coverage in a vertical and/or lateral direction. For instance, in a preferred embodiment, the soldering material covers the conduction surface of the electrode connection slug regardless of whether another element such as the first routing circuitry is between the conduction surface and the soldering material.

The term "surround" refers to relative position between elements regardless of whether the elements are spaced from or adjacent to one another. For instance, in a preferred embodiment, the dielectric layer laterally surrounds the electrode connection slug and is spaced from the electrode connection slug by the organic resin binder.

The phrases "mounted on/to" and "attached on/to" include contact and non-contact with a single or multiple support element(s). For instance, in a preferred embodiment, the semiconductor device can be attached on the electrode connection slug and is separated from the electrode connection slug by the soldering material.

The phrases "electrical connection", "electrically connected" and "electrically coupled" refer to direct and indirect electrical connection. For instance, in a preferred embodiment, the semiconductor device is electrically connected to the electrode connection slug by the soldering material but does not contact the electrode connection slug.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A semiconductor assembly, comprising a top substrate, a base substrate and a semiconductor device, wherein:

the top substrate includes an electrode connection plate, a plurality of vertical posts protruding from a substantially planar inner surface of the electrode connection plate, and a flatness control layer on a substantially planar outer surface of the electrode connection plate opposite to the substantially planar inner surface, wherein the top substrate is electrically connected to the base substrate using a first soldering material between the vertical posts and the base substrate and the inner surface of the electrode connection plate provides a first conduction surface for electrical and thermal conduction with the semiconductor device;

the base substrate includes a dielectric layer, an electrode connection slug, a first routing circuitry on a substantially planar first surface of the dielectric layer, and a second routing circuitry on an opposite substantially planar second surface of the dielectric layer, wherein the electrode connection slug is embedded in the dielectric layer and provides a second conduction surface for electrical and thermal conduction with the semiconductor device, and the first routing circuitry and the second routing circuitry are electrically connected to each other; and the semiconductor device includes a first electrode layer at a first surface of the semiconductor device and a second electrode layer at an opposite second surface of the semiconductor device, wherein the first electrode layer of the semiconductor device is attached to the first conduction surface and is electrically connected to the base substrate through the top substrate and the first soldering material, and the second electrode layer of the semiconductor device is superimposed over the second conduction surface and electrically connected to the second routing circuitry through the electrode connection slug and a second soldering material between the second electrode layer of the semiconductor device and the base substrate.

2. The semiconductor assembly of claim 1, wherein the first conduction surface has an area of 1 mm$^2$ or more.

3. The semiconductor assembly of claim 1, wherein the second conduction surface has an area of 0.1 mm$^2$ or more.

4. The semiconductor assembly of claim 1, wherein the electrode connection slug has a thickness of 0.1 mm or more.

5. The semiconductor assembly of claim 1, wherein the electrode connection plate has a thickness of 0.1 mm or more.

6. The semiconductor assembly of claim 1, wherein the base substrate further includes glass fibers impregnated in the dielectric layer.

7. The semiconductor assembly of claim 1, wherein the first routing circuitry and the second routing circuitry are electrically connected to each other through vertical connecting elements in the dielectric layer.

8. The semiconductor assembly of claim 1, wherein the top substrate has a thermal conductivity greater than 10 W/mK and an electrical resistivity less than 0.1 μohm-m.

9. The semiconductor assembly of claim 1, wherein the electrode connection slug has a thermal conductivity greater than 10 W/mK and an electrical resistivity less than 0.1 μohm-m.

10. The semiconductor assembly of claim 1, wherein the first conduction surface is attached to the first electrode layer of the semiconductor device using a soldering material having a thermal conductivity greater than 10 W/mK and an electrical resistivity less than 1 μohm-m.

11. The semiconductor assembly of claim 1, wherein the first soldering material has a thermal conductivity greater than 10 W/mK and an electrical resistivity less than 1 μohm-m.

12. The semiconductor assembly of claim 1, wherein the second soldering material has a thermal conductivity greater than 10 W/mK and an electrical resistivity less than 1 μohm-m.

13. The semiconductor assembly of claim 1, wherein no thermal barrier material having a thermal conductivity less than 1 W/mK is present between the first conduction surface of the top substrate and the first electrode layer of the semiconductor device.

14. The semiconductor assembly of claim 1, wherein no thermal barrier material having a thermal conductivity less than 1 W/mK is present between the second conduction surface of the base substrate and the second electrode layer of the semiconductor device.

15. The semiconductor assembly of claim 1, wherein the flatness control layer includes fibers or fillers in a resin material.

16. The semiconductor assembly of claim 1, further comprising an additional device stacked over the flatness control layer and electrically connected to the electrode connection plate.

17. The semiconductor assembly of claim 16, wherein the flatness control layer has an opening to accommodate a third soldering material in contact with the additional device and the substantially planar outer surface of the electrode connection plate.

* * * * *